United States Patent
Ueshima et al.

(10) Patent No.: US 10,272,527 B2
(45) Date of Patent: Apr. 30, 2019

(54) SOLDER ALLOY, AND LED MODULE

(71) Applicant: Senju Metal Industry Co., Ltd., Tokyo (JP)

(72) Inventors: Minoru Ueshima, Tokyo (JP); Takeshi Sakamoto, Tokyo (JP); Rei Fujimaki, Tokyo (JP)

(73) Assignee: Senju Metal Industry Co., Ltd., Tokyo (JP)

(*) Notice: Subject to any disclaimer, the term of this patent is extended or adjusted under 35 U.S.C. 154(b) by 101 days.

(21) Appl. No.: 15/300,929

(22) PCT Filed: Apr. 2, 2015

(86) PCT No.: PCT/JP2015/060527
§ 371 (c)(1),
(2) Date: Sep. 30, 2016

(87) PCT Pub. No.: WO2015/152387
PCT Pub. Date: Oct. 8, 2015

(65) Prior Publication Data
US 2017/0014955 A1    Jan. 19, 2017

(30) Foreign Application Priority Data

Apr. 2, 2014    (JP) .................... 2014-076569

(51) Int. Cl.
*B23K 35/26*    (2006.01)
*C22C 13/02*    (2006.01)
(Continued)

(52) U.S. Cl.
CPC ............ *B23K 35/262* (2013.01); *B23K 35/26* (2013.01); *C22C 13/02* (2013.01); *H01L 33/52* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 6,229,248 B1 | 5/2001 | Kusabiraki et al. | |
| 7,682,468 B2 | 3/2010 | Munekata et al. | |
| 8,749,263 B2 | 6/2014 | Ohta et al. | |
| 2011/0067911 A1 | 3/2011 | Ishikawa et al. | |
| 2011/0242450 A1* | 10/2011 | Kashimura | H05K 3/3442 349/61 |

(Continued)

FOREIGN PATENT DOCUMENTS

| | | |
|---|---|---|
| EP | 2290676 A1 | 3/2011 |
| JP | 550286 A | 3/1993 |

(Continued)

*Primary Examiner* — Ratisha Mehta
(74) *Attorney, Agent, or Firm* — The Webb Law Firm (57) ABSTRACT

Provided is a solder alloy having a composition suitable for soldering a module obtained by joining an aluminum substrate to a component wherein a main body, in which the area of an electrode on a side surface is not more than 30% of the total area of the side surface, is comprised of a ceramic. The solder alloy has an alloy composition comprising, in terms of mass %, 3-10% of Sb, 0-4% of Ag and 0.3-1.2% of Cu, with the remainder consisting of Sn. Furthermore, the alloy composition may contain, in terms of mass %, a total of 0.15% or less of one or more elements selected from among Ni and Co and/or a total of 0.02% or less of one or more elements selected from among P and Ge.

19 Claims, 3 Drawing Sheets

(51) Int. Cl.
*H01L 33/62* (2010.01)
*H01L 33/52* (2010.01)
*C22C 9/00* (2006.01)
*C22C 21/00* (2006.01)

(52) U.S. Cl.
CPC ............ *H01L 33/62* (2013.01); *C22C 9/00* (2013.01); *C22C 21/00* (2013.01); *H01L 2224/16225* (2013.01)

(56) References Cited

U.S. PATENT DOCUMENTS

| | | |
|---|---|---|
| 2012/0049882 A1 | 3/2012 | Ohta et al. |
| 2013/0098506 A1 | 4/2013 | Toyoda et al. |
| 2013/0328088 A1* | 12/2013 | Morikawa ............... H01L 33/44 257/98 |
| 2015/0062930 A1* | 3/2015 | Chang ................. H01L 25/0753 362/364 |
| 2015/0136461 A1* | 5/2015 | Imamura ................. B23K 1/00 174/259 |

FOREIGN PATENT DOCUMENTS

| | | |
|---|---|---|
| JP | 10286689 A | 10/1998 |
| JP | 200394195 A | 4/2003 |
| JP | 20115521 A | 1/2011 |
| JP | 201249480 A | 3/2012 |
| JP | 201457974 A | 4/2014 |
| WO | 2011151894 A1 | 12/2011 |
| WO | 2014003006 A1 | 1/2014 |

\* cited by examiner

SOLDER ALLOY, AND LED MODULE

CROSS-REFERENCE TO RELATED APPLICATIONS

This application is the United States national phase of International Application No. PCT/JP2015/060527 filed Apr. 2, 2015, and claims priority to Japanese Patent Application No. 2014-076569 filed Apr. 2, 2014, the disclosures of which are hereby incorporated in their entirety by reference.

TECHNICAL FIELD

The present invention relates to a solder alloy, particularly to a solder alloy provided for the purpose of improving reliability in soldering a component having on its side surface an electrode with a small area to an aluminum substrate (hereinafter called "Al substrate").

BACKGROUND ART

Reliability evaluations have been carried out for determining whether soldered components keep necessary properties and functions under certain conditions, and various tests are conducted depending on the intended application. For instance, the strength of a joint portion is examined. In a heat cycle test, for example, a low temperature state and a high temperature state are repeated at regular intervals, and the number of cycles required for a soldered joint portion to reach a predetermined state (predetermined strength) is taken as the criterion for strength. In general, the type of desired reliability differs depending on usage, and the optimal composition of solder alloy is determined in accordance therewith. Accordingly, a variety of compositions of solder alloys that can achieve the optimal reliability have been studied and proposed, one example of which is described in Patent Literature 1.

In the Patent Literature 1, claim 1 discloses "a high-temperature solder comprising an alloy having a composition containing more than 3.0 wt % but not more than 5.0 wt % of Ag and 0.5 to 3.0 wt % of Cu, with a balance of Sn, and being capable of forming a soldered portion excellent in thermal fatigue-resistance," and claim 2 discloses "the high-temperature solder according to claim 1, further comprising 5% or less of Sb."

The Patent Literature 2 discloses an LED component in which "an electrode structure of an insulated substrate constituting a front surface implementing type device, in which a semiconductor chip is implemented on the insulated substrate, is formed to have an electrode structure of high reliability, in which the front surface electrode and the back surface electrode thereof are connected with each other through a plurality of connection electrodes, and further, in such an electrode structure, inspection for a bad connection can be reliably performed between the front surface electrode or back surface electrode and any of the plurality of connection electrodes."

CITATION LIST

Patent Literature

Patent Literature 1: JP 05-050286 A
Patent Literature 2: JP 2012-49480 A

SUMMARY OF INVENTION

Technical Problems

Conventionally, while a variety of solder alloy compositions have been proposed in accordance with usage environments and intended applications, those solder alloys are primarily used for soldering general components, and there has been no study of an optimal composition to be used to solder a semiconductor light emitting device, particularly, an LED component.

In the meantime, recently, owing to the high light emitting efficiency, LED components including those for lighting purposes have been broadly used, and various techniques as to production methods and usages thereof have been proposed. In an LED component, generally, a light emitting device is bonded to a ceramic base such as Si3N4, SiC, Al2O3, AlN and SiO2 with a metal such as an Au—Sn alloy or sintered Ag paste that does not melt at 260° C., an electrode is formed on the ceramic base using Cu or Ag, and the light emitting device and a circuit electrode formed on the ceramic base are bonded with an Au, Cu or Al wire. Accordingly, the mechanical properties of the LED component is substantially same as those of ceramic, having such a small expansion as a thermal expansion coefficient of about 3 to 6 ppm/° C.

In addition, in an LED component, heat dissipation needs to be improved since a light emitting device mounted therein generates a large amount of heat, and as the luminance increases, use of an Al substrate having high heat dissipation has become more frequent. An LED component is soldered to an Al substrate as described above to form a so-called LED module. An Al substrate has a linear expansion coefficient of about 23 ppm/° C., that is, a relatively large thermal expansion, and when an LED is soldered to an Al substrate, the soldered joint portion would be subjected to a significantly high load. An Al substrate refers to what is made using Al having good heat dissipation as a base material, on which a circuit is formed from copper foil via an insulating material.

Moreover, in the production process of an LED component, since a side-surface electrode, a lower-surface electrode, and an upper-surface electrode upon which a light emitting device will be disposed are simultaneously formed at a single ceramic substrate, the side-surface electrode is formed with a through-hole via at the same time. Subsequently, the device is die-bonded and wire-bonded, and is further molded, and the ceramic substrate is cut off. When the ceramic substrate is cut off and the through-hole via is exposed at a side surface, a small side-surface electrode is formed. However, an area of the electrode on the side surface of the ceramic base is so small that no fillet is formed on an electrode-free portion of the side surface of the component. In the LED component like this, an area of the side-surface electrode accounts for 30% or less of an area of the side surface, and the LED component is soldered only to the lower-surface electrode, whereby a soldered portion would readily fall off due to thermal fatigue, and crack propagation would proceed in the lower-surface electrode in the LED component, leading to a shorter life of the joint portion, which is a problem.

The present invention attempts to solve the problem and provides a solder alloy for an LED component having resistance to thermal fatigue and realizing a long life of a joint portion even when used for an LED component in which a side-surface electrode is formed of a through-hole via, which is the only electrode formed at a side surface thereof.

Solution to Problems

The present inventors have discovered that a Sn—Cu based solder alloy to which Sb is added is suitable as a solder alloy for soldering between an LED component and an Al substrate when a side-surface electrode is formed of a through-hole via and no other electrode is formed on the side surface in the LED component, and when a solder is adhered only to a lower-surface electrode for soldering the LED component to a printed circuit board, and have completed the present invention.

The present invention relates to a solder alloy for use in a module in which a component having a ceramic main body and an Al substrate are bonded together, the solder alloy comprising, by mass %: 0 to 4% of Ag (including 0); 0.3 to 1.2% of Cu; 3 to 10% of Sb, and a balance of Sn.

In general, Bi has been added to a Sn—Cu based solder alloy to impart thermal-fatigue properties to the alloy. More specifically, addition of Bi to a Sn based solder alloy is very efficient in improving the reliability of a soldered joint portion between a chip resistor whose opposite surfaces are entirely formed of electrodes and a printed circuit board such as FR-4. Meanwhile, in a soldered joint portion between an LED component with a ceramic base and an Al substrate, the ceramic base having a linear expansion coefficient that is not so different from that of a chip resistor, addition of Bi exhibits little life extension effect, whereas Sb is particularly effective.

The most significant difference between an additive amount of Sb and that of Bi is that while Bi forms a solid solution in Sn, an excessive addition of Bi would lead to crystallization of Bi itself in a solder, thereby largely lowering elongation of the solder. In particular, during solidification of the solder, Bi tends to locally segregate, so ductility of the solder would be locally poor. Once crack propagation proceeds, stress concentrates on a leading portion of the crack to further promote the crack propagation. Hence, a soldered joint portion in which Bi having high strength but extremely poor ductility is coarsely segregated is not suitable for a solder alloy for soldering between an LED component and an Al substrate, as in the LED component, a side surface is not entirely formed of an electrode, and a large solder fillet cannot be formed on a ceramic base.

On the other hand, while similarly forming a solid solution in Sn, Sb does not undergo significant segregation in a solder fillet, and remaining insoluble part of Sb having not formed a solid solution is finely dispersed in a solder alloy as a SnSb intermetallic compound. Rather, the finely dispersed SnSb intermetallic compound does not largely lower ductility and can improve the strength of the solder alloy, so Sb is an extremely efficient additive element for a soldered joint portion between such an LED component and an Al substrate.

In the production process of an LED component, a side-surface electrode, a lower-surface electrode, and further an upper-surface electrode on which a light emitting device is further disposed are simultaneously formed on a single ceramic substrate, and, hence, the side-surface electrode is formed with a through-hole via at a time. It is characterized in that the device is then die-bonded and wire-bonded, and is further molded, and the ceramic substrate is cut off.

Hence, the LED component has substantially no electrode on its side surface and thus no solder fillet being formed on the side surface, differently from other ceramic components such as a chip resistor and a chip capacitor, in each of which a solder fillet can be formed on its side surface, and the LED component is bonded to an Al substrate with only a soldered joint portion between the lower surface of the component and the Al substrate. In general, when a side-surface electrode accounts for such a small area as 30% or less of the entire area of the side surface, no solder fillet can be formed on the side surface, and the LED component is bonded to an Al substrate with only a soldered joint portion between the lower surface of the component and the Al substrate. Hence, the LED component of the invention is defined to have a configuration in which an area of a side-surface electrode accounts for not more than 30% of the entire area of the side surface. An area of a side-surface electrode here in the invention refers to an area of an electrode portion that can be seen when the component is viewed from the side surface side, not an area of an inner side surface in a semicircular shape of a through-hole via.

The invention relates to a solder alloy for use in a module in which a component and an Al substrate are bonded, the component having a main body made of ceramic and having a side-surface electrode with an area of not more than 30% of an entire area of a side surface, the solder alloy comprising, by mass %: 0 to 4% of Ag; 0.3 to 1.2% of Cu; 3 to 10% of Sb, and a balance of Sn.

Further, the invention relates to the solder alloy additionally comprising, by mass %, not more than 0.15% in total of at least one element selected from Ni and Co.

Further, the invention relates to the solder alloy additionally comprising, by mass %, not more than 0.1% in a total amount of at least one element selected from P and Ge.

Further, the solder alloy has an average shear stress of 25 MPa or more.

Further, the solder alloy has a minimum shear stress of 15 MPa or more.

Further, the solder alloy is characterized in that the component is an LED component.

Further, the invention relates to an LED module in which an LED component having the solder ally is mounted.

Further, the invention relates to an LED module in which an LED component and an Al substrate are bonded with the solder alloy according to any one of claims 1 to 4, the LED component having a ceramic substrate and a light emitting device disposed on the ceramic substrate, being cut at a through-hole via portion in the ceramic substrate after the light emitting device is molded, and having a side-surface electrode with an area of not more than 30% of an entire area of a side surface, and the Al substrate having an insulation layer formed thereon and a Cu electrode formed on the insulation layer.

Effect of Invention

In the solder alloy of the invention in which 3 to 10% of Sb is added to a Sn—Cu solder alloy, a SnSb intermetallic compound is finely dispersed in the solder alloy and improves the strength of the solder alloy. Accordingly, the solder alloy provides an effect to suppress crack generation without a decrease in shear stress even in an LED component in which a side-surface electrode is formed with a through-hole via, and a solder fillet can be formed only with a lower-surface electrode.

DESCRIPTION OF EMBODIMENTS

The present invention will be described below in detail. In the present description, a percentage (%) with respect to a solder alloy composition refers to a percentage by mass (mass %) unless otherwise specified.

As described above, while an LED component often has a linear expansion coefficient of about 3 to 6 ppm/° C., an Al substrate has such a very high linear expansion coefficient as about 23 ppm/° C. that a load on a soldered joint portion significantly increases. In addition, on the ground of the limitation of production process of the LED component, an area of a side-surface electrode of a ceramic base may be small so that a solder fillet may be small, or even though a fillet is apparently formed, a portion of the side surface where an electrode is not formed may not be bonded with a solder, whereby the soldered joint portion may easily fall off due to thermal fatigue. Accordingly, in the LED component, a life of the joint portion depends on a crack propagation in a solder at the joint portion between a lower-surface electrode and the substrate.

(Configuration of a Component)

Figure 1:
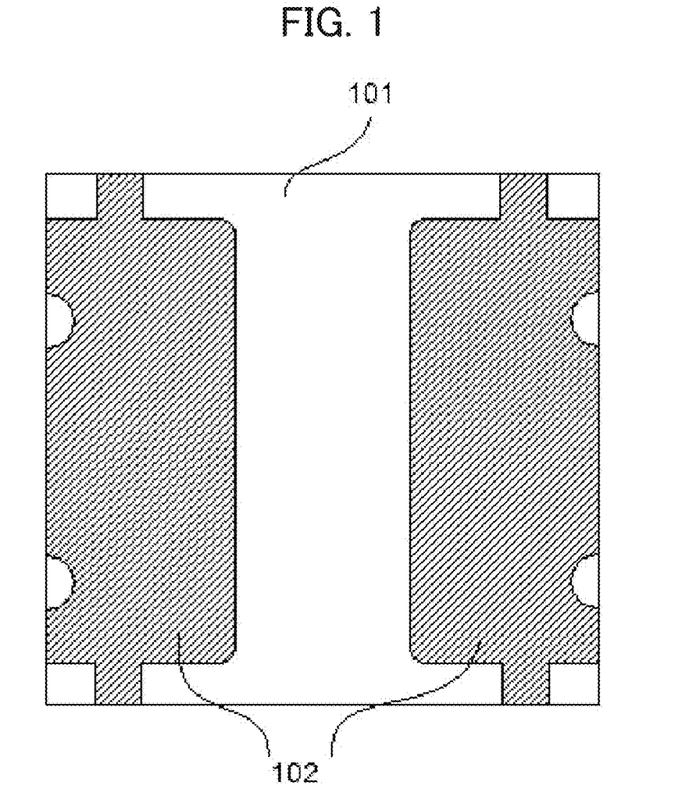
FIG. 1 is a schematic view for illustrating an example of a bottom surface of an LED component.

FIG. 1 illustrates a bottom surface 101 of the LED component, with electrodes 102 having an anode and a cathode. In an LED component having a side-surface electrode accounting for an area of not more than 30% of an entire surface of the side surface, a total area of electrodes including an anode and a cathode is designed to account for 10% to 80% of an entire area of a lower surface of the component. The electrode area including a cathode and an anode can be relatively large if no joint portion for heat dissipation is provided. However, particularly when the LED component is a type of high luminance, sufficient heat dissipation cannot be ensured without providing an electrode for heat dissipation right beneath a light emitting device, and therefore the total area of an anode and a cathode has to be small, whereby crack propagation at a soldered portion for soldering the electrodes is further accelerated.

Figure 2:
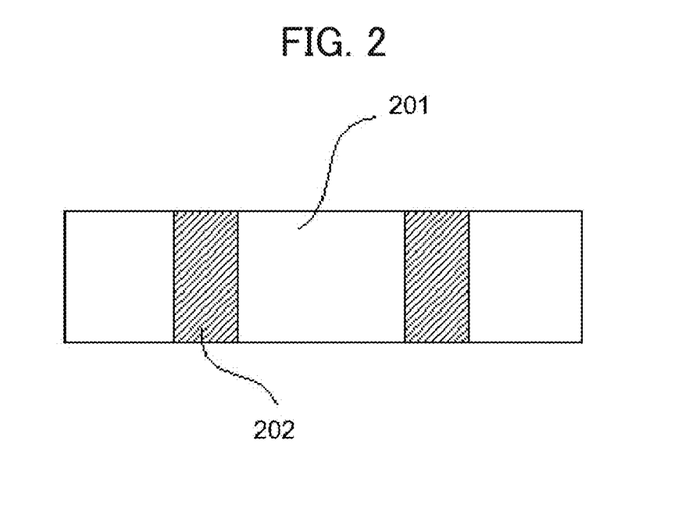
FIG. 2 is a schematic view for illustrating an example of a side surface of the LED component, where an area of a side-surface electrode accounts for not more than 30% of an entire area of the side surface.

FIG. 2 illustrates a side surface 201 of the LED component, with electrodes 202 to pass a current to an upper surface of the component so as to supply the light emitting device with a current from the lower-surface electrodes. In addition, in some components, a current is supplied via a through-hole via in a ceramic substrate and a side-surface electrode is not provided, and in this case, no side-surface electrode but only the lower-surface electrode can be soldered. Accordingly, when the existing side surface is provided with a circuit to pass a current from a lower-surface electrode to the light emitting semiconductor device, an electrode area would be up to 30% of that of the side surface.

In the production process of the LED component, the side-surface electrode, the lower-surface electrode, and further the upper-surface electrode on which a light emitting device is disposed are simultaneously formed on a single ceramic substrate, and, hence, the side-surface electrode is formed with a through-hole via at a time. Subsequently, the device is die-bonded and wire-bonded, and is further molded, and the ceramic substrate is cut off. If the LED component is cut off and a through-hole via is exposed at the side surface, a small side-surface electrode would be formed. However, the production method of the electrode would be quite different from that for a typical chip resistor or the like in which an electrode is formed over the entire side surface.

Figure 3:
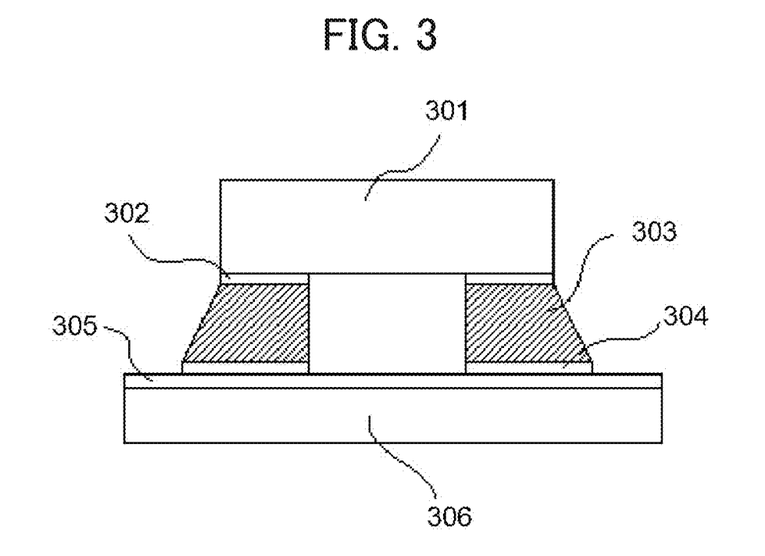
FIG. 3 is a schematic view for illustrating an example of a side surface of an LED module in which the LED component is soldered to an Al substrate.

FIG. 3 illustrates a side view schematically showing an LED module in which an LED component 301 is soldered to an Al substrate 306. The LED module is mainly composed of the LED component 301 and the Al substrate 306, the LED component 301 and the Al substrate 306 being bonded by solder 303. The LED component 301 emits visible light of a single color by being directly supplied with a current. The LED component 301 is provided with Ni/Sn or Ni/Au plated electrodes 302 on the lower surface thereof. The Al substrate 306 includes Cu electrodes 304 and an insulation layer 305.

When the LED component 301 shown in FIG. 3 is soldered to the Al substrate 306, the solder 303 bonds an Sn electrode 302 with a Ni base or an Au electrode 302 with a Ni base of the light emitting device to the Cu electrodes 304 of the Al substrate 306, while a solder alloy is not applied to a side surface of the LED component 301. FIG. 3 shows a case where the LED component does not have a side-surface electrode at all. Also in a case where the side-surface electrode has an area of not more than 30% of an entire area of the side surface as illustrated in FIG. 2, an amount of the solder alloy applied to the side surface is not so much as to effectively affect its strength, and therefore this is not different from the case shown in FIG. 3.

Figure 4:
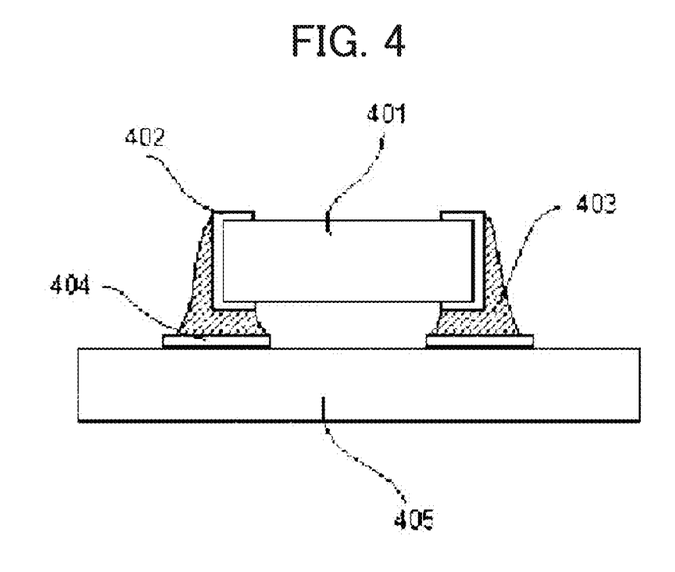
FIG. 4 is a schematic view for illustrating an example of a side surface of an LED module in which a chip resistor is soldered to a glass epoxy substrate (FR-4).

In the meantime, FIG. 4 is a side view of a module in which a typical chip resistor 401 is soldered to a glass epoxy substrate (FR-4) 405. The typical module is mainly composed of the chip resistor 401 and the glass epoxy substrate (FR-4) 405, the chip resistor 401 and the glass epoxy substrate 405 being bonded by solder 403. The chip resistor 401 is provided with Ni/Sn plated electrodes at its opposite side ends, while the glass epoxy substrate (FR-4) 405 is provided with Cu electrodes 404. When using a chip resistor, a fillet of the solder 403 is formed on each side surface, and the chip resistor is firmly soldered to the glass epoxy substrate (FR-4) from the bottom surface to the side surface of the chip resistor. In the LED module shown in FIG. 3, on the other hand, since only the bottom surface is soldered, the bonding strength of the soldered joint portion would decrease.

Figure 5:
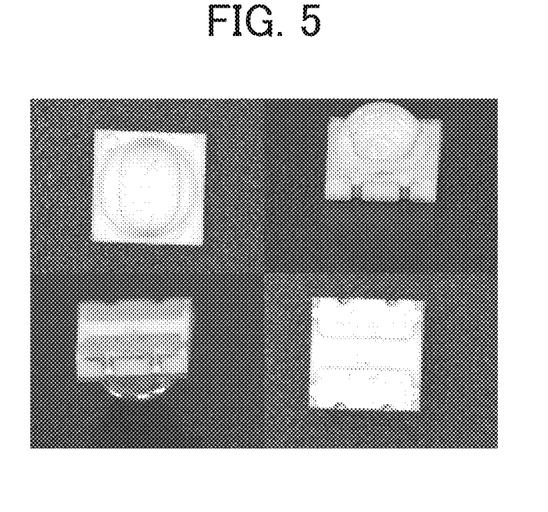
FIG. 5 is an image of photographs of a general LED component.

FIG. 5 is an image of photographs of a general LED component for which the invention is employed. The photographs of an upper surface, a side surface viewed obliquely from above, a bottom surface and a side surface viewed obliquely from below of the LED component are respectively shown at the upper left corner, the upper right corner, the lower right corner and the lower left corner in the image. As the photograph of the bottom surface at the lower right corner in FIG. 5 shows, in the LED component, a Cu or Sn solder layer for soldering to a substrate is provided on the lower surface that is opposite from the surface that emits light, and, normally, such a metal portion is soldered such that the substrate and the LED component are bonded. As the photographs of the side surface at the upper right corner and the lower left corner show, a solder layer is hardly formed on the side surface of the LED component. Accordingly, when the LED component is soldered to the Al substrate, soldering is made as illustrated in FIG. 3, apparently resulting in the lower strength of the joint portion, compared to a normal chip resistor.

It has been described above that, when an LED component is soldered, the strength, particularly against thermal fatigue, decreases as compared to a conventional chip resistor from the standpoint of the structure. Next, based on the above structural characteristics, the properties of solder when an LED component is soldered will be described from a standpoint of the solder alloy composition.

That is, due to the specificity of such a soldering state, the heat cycle properties of the LED component attributable to the difference in the composition of the LED component are different from those of a chip resistor. For instance, as apparent from Examples to be described later, as to soldering of a chip resistor, the heat cycle life would be longer as the solder alloy composition that increases hardness is used, whereas in the LED component, even if a solder alloy composition having high hardness is used, the heat cycle life would be sometimes short.

When an Sn-3Ag-0.5Cu alloy having low strength is used, once crack propagation proceeds, the strength of the solder itself would be low, allowing the crack to run through the solder. Further, in view of the relation between an additive element to the alloy and the crack propagation due to thermal fatigue, the crack propagation largely depends on the element that improves the strength, rather than on the solder strength. Accordingly, results of a heat cycle test on various different solder alloy compositions are shown as comparative examples, particularly, with respect to the solder properties when used at a high temperature.

In consideration of the soldering state with a solder alloy having each of the compositions, in a solder, Ag forms a fine needle-like intermetallic compound of $Ag_3Sn$ which is dispersed in the network, thereby improving the strength of the solder and suppressing the crack propagation. However, the $Ag_3Sn$ would readily coarsen due to the temperature load at 125° C. or higher and the stress, and the strength improving effect would disappear particularly at the tip portion where the crack propagation has proceeded. Accordingly, in a component where a solder fillet is hardly formed on the side surface of the component like the LED component, it is difficult to suppress the crack propagation due to thermal fatigue at the highest temperature of 125° C. or higher with the use of only an alloy to which Ag is added.

When Cu or Ni is added, an intermetallic compound such as $Cu_6Sn_5$, $(CuNi)_6Sn_5$ or $Ni_3Sn_4$ is dispersed in the network to thereby improve the strength of the solder, but the strength improving effect of Cu or Ni is lower than that of Ag, and the intermetallic compound readily coarsens due to the temperature load at 125° C. or higher and the stress, and the strength improving effect would disappear. On the contrary, Sb or Bi is dispersed in Sn and improves the strength of the Sn itself, while such effect will be hardly affected either by the temperature load at 125° C. or higher or the stress.

However, an excessive addition of Bi significantly decreases ductility of the solder (the solder composition of Sn-3Ag-0.8Cu-3Bi-0.02Ni has an elongation rate of 24%). In bonding an LED component, when the linear expansion coefficient difference between the LED component and the Al substrate is 15 ppm or more, the component alone has a size of 2 mm squares or larger, and a solder fillet is hardly formed on a side surface of the component, the heat cycle causes local stress concentration in a solder fillet, and a soldered joint portion also distorts in a wide area. Hence, a crack is likely to occur if distortion is repeated. In addition, the ductility reducing effect due addition of Bi would sufficiently appear even at a high temperature of 150° C., thereby preventing the solder from deforming and making it difficult to relax the stress.

In the meantime, while Sb also improves the strength of solder like Bi does, when an amount of Sb to be added exceeds 10%, ductility of the solder (Sn-3Ag-10Sb-1Cu-0.02Ni) decreases to an elongation rate at room temperature of 39%. However, at a high temperature of 125° C., ductility is reversely improved to an elongation rate of 53%. While as described above, Bi and Sb similarly improve the strength of Sn, they have largely different ductility behavior, particularly at high temperature. Addition of Sb improves the solder strength and, at the same time, can improve stress relaxation at high temperature, and is therefore effective in bonding between an LED component and an Al substrate where a high strength as well as stress relaxation at high temperature are required. The strength improvement through addition of Sb can significantly extend the life of a joint portion.

It is known that Bi or Sb forms a solid solution in Sn, improves the strength of Sn, and improves the heat cycle properties of a chip resistor or the like that is mounted on a printed circuit board such as FR-4. A chip resistor is characterized in being provided with metal electrodes formed entirely on its opposite side surfaces, and tends to have a longer life if solder has a higher strength. Although a crack relatively readily propagates in a soldered joint portion at the bottom portion of a chip resistor, there is a large solder fillet in which crack propagation is slow, and hence, the chip resistor has a longer life if an alloy having a high tensile strength particularly at high temperature is used.

However, because of the production process of an LED component made of a ceramic base, an electrode cannot be formed on an entire side surface of the LED component. Moreover, an Al base has been used as a substrate in recent years in order to efficiently dissipate the heat generated from an LED. Compared to the typical FR-4, an Al base has a large linear expansion coefficient and high stiffness, and hence a load on a soldered joint portion at the time of heat cycle test becomes larger. In addition, since an LED component cannot be easily provided with an electrode on its entire side surface unlike a chip resistor, the LED component has to be bonded at its lower-surface electrode and the bonding has to be maintained.

The Patent Literature 2 describes that by providing two electrodes on one side surface, even if one of the two electrodes becomes inoperative, electric connection can be maintained by the other one of the electrodes. However, at a soldered joint portion between an LED component made of a ceramic base and a substrate made of an Al base, a crack propagates from a center portion of the bottom surface through the soldered joint portion. When a crack has generated in a part of one of side-surface electrodes, a soldered joint portion on the anode side or on the cathode side should already have a crack propagating broadly therein; even though electrical connection is still maintained, the crack would shortly run through one of the electrodes thoroughly, resulting in an electrical disconnection. Accordingly, a life extension is essentially not possible in a heat cycle test, unless crack generation is prevented.

In addition, a soldered joint portion on an LED component has not only a function of establishing electrical connection but also an important function of releasing heat generated from the LED component. While an electrical disconnection causes a problem such as light emitting failure of an LED, as heat dissipation decreases, the LED and an organic substance around the LED can possibly burn due to the heat in some cases. Accordingly, a metal substrate such as an Al substrate that does not ignite is more preferable to an organic base such as FR-4. In order to prevent the LED itself from igniting, it is required not only to maintain electrical connection but also sufficiently suppress crack propagation.

A Sn—Cu based solder alloy with addition of Bi is effective in improving reliability of a soldered joint portion between a chip resistor having electrodes on its entire opposite surfaces and a printed circuit board such as FR-4. Meanwhile, in a soldered joint portion between an LED component made of a ceramic base and an Al substrate, the ceramic base having a linear expansion coefficient that is not so different from that of a chip resistor, addition of Bi exhibits very little life extension effect, whereas Sb is particularly effective. While an increased amount either of Bi or Sb to be added to a SnAgCu alloy increases the tensile strength of the alloy both at room temperature and high temperature of 125° C. or higher, leading to similar mechanical properties, as an amount of added Bi increases, an elongation rate of an alloy decreases, and an elongation rate of an Sn3Ag1Cu5Bi alloy decreases to 20% or lower.

On the other hand, even if an amount of added Sb increases, the elongation rate does not largely decrease; if the amount of addition is not more than 10%, the elongation rate is 30% or more at both room temperature and high temperature of 125° C. or higher. When a large solder fillet is formed on a side surface of a component, elongation of the solder hardly affects crack propagation, and thus the component can be rigidly held on opposite surfaces thereof with fillets of the alloy that does not elongate, achieving an effect similar to molding a soldered joint portion itself.

However, if an electrode cannot be formed on an entire side surface, the effect to hold a component at both opposite sides becomes small, and hence the properties of solder at the bottom part of the component is very important. At the bottom part of the component, the solder largely deforms through a heat cycle because of a difference in the linear expansion coefficient between an Al base and the component. Since ductility of a SnAgCu alloy to which Bi is added decreases, even if having a high strength, the alloy cannot bear a large deformation. Hence, an additive element such as Sb that can both improve the strength and obtain ductility is effective.

The most significant difference between an additive amount of Sb and that of Bi is that while Bi forms a solid solution in Sn, an excessive addition of Bi would lead to crystallization of Bi itself in a solder, thereby largely lowering elongation of the solder. In particular, during solidification of the solder, Bi tends to locally segregate, so ductility of the solder would be locally poor. Once crack propagation proceeds, stress concentrates on a leading portion of the crack to further promote the crack propagation. Hence, a soldered joint portion in which Bi having high strength but extremely poor ductility is coarsely segregated is not suitable for a solder alloy for soldering between an LED component and an Al substrate, as in the LED component, a side surface is not entirely formed of an electrode, and a large solder fillet cannot be formed on a ceramic base.

On the other hand, while similarly forming a solid solution in Sn, Sb does not undergo significant segregation in a solder fillet, and remaining insoluble part of Sb having not formed a solid solution is finely dispersed in a solder alloy as a SnSb intermetallic compound. Rather, the finely dispersed SnSb intermetallic compound does not largely lower ductility and can improve the strength of the solder alloy, so Sb is an extremely efficient additive element for a soldered joint portion between such an LED component and an Al substrate. When an amount of added Sb is too small, Sb simply forms a solid solution in Sn, while the fine SnSb intermetallic compound does not forms a solid solution in Sn matrix, failing to suppress crack propagation. Therefore, addition of at least 3% of Sb is necessary.

On the other hand, when an excessive amount of Sn is added, the SnSb intermetallic compound becomes coarse. Even if some of the SnSb intermetallic compound is finely dispersed, ductility would largely decrease, allowing crack propagation to accelerate. Therefore, an amount of Sb to be added is preferably not more than 10%.

Moreover, addition of Ag also improves the tensile strength, and if Ag is also added when Sb is added, crack propagation in a heat cycle test can be suppressed. However, since an excessive addition of Ag generates coarse Ag3Sn which decreases elongation largely, an amount of Ag to be added is preferably 1 to 3%. An LED component made of a ceramic base often uses Ni for forming an electrode, an outermost surface of which is plated with Au or Ag. Accordingly, when solder contains no Cu, a Ni electrode would undergo a significant solder erosion and lead to detachment of the LED, so an amount of at least 0.3% of Cu needs to be added. Further, if an excessive amount of Cu is added, coarse Cu6Sn5 would be formed and accelerate crack propagation in a soldered joint portion at the bottom part of the LED, and therefore an amount of Cu to be added is preferably not more than 1.2%.

Moreover, while an effect of strength improvement achieved by addition of Cu and Ag would be impaired by thermal fatigue, addition thereof provides an effect to retard crack propagation in a joint portion, and, in addition, the compound is dispersed in the network, preventing local decrease in strength of the Sn matrix due to uneven distribution of Sb, whereby occurrence of extreme crack propagation can be suppressed.

Addition of Ni or Co leads to precipitation of a compound as an intermetallic compound with Sn at the beginning of solder solidification, and Sn dendrite is micronized, thereby providing an effect to homogenize the solder structure. As a result, reliability can be improved. In particular, when Ni or Co is crystallized as a primary crystal, the Cu density of the molten solder near the compound temporarily decreases, resulting in the composition having a solidus curve that is locally high. In addition, regarding crystallization of the compound, since the supercooling state occurs, once a liquid layer having a low Cu density is formed, crystallization of Sn immediately initiates. If an amount of the element or elements selected from Ni and Co to be added exceeds 0.15% in total, the solder wettability becomes poor.

Addition of P or Ge has an effect to prevent discoloration of solder. Particularly, on an LED component, it is preferable that discoloration of a solder fillet that may affect the light emission color of the LED does not occur, and the color of a fillet is preferably silvery white. If an amount of the element or elements selected from P and Ge to be added exceeds 0.1% in total, hardness of the solder increases, and crack propagation in a soldered joint portion would not be readily suppressed.

As described above, when an LED component is soldered, a solder alloy having a different composition from that ordinarily used for a chip resistor and having resistance to high temperatures may be possibly effective, for the reason that the LED component tends to generate heat when emitting light. In particular, for use in an LED component, the heat cycle life can be extended longer by addition of Sb than by addition of Bi which facilitates suppression of crystal strain in general. Hence, there is a specific composition for a solder alloy to be used for an LED component.

EXAMPLES

Here, alloys in Examples and Comparative Examples shown in Table 1 were used as solder alloys. Using solder alloys having the respective compositions, 10 to 14 LED components and chip resistors each were soldered to Al substrates of 1.5 mm thickness and were determined for strength of each soldered joint portion by means of a heat cycle test, each of the LED components having a 2.8 mm×2.8 mm size with a side-surface electrode accounting for 0% or 25% of an entire area of the side surface; and each of the chip resistors having a 3.2 mm×1.6 mm (3216R) size with a side-surface electrode accounting for 100% of an entire area of the side surface. Here, the soldered joint portion was formed at a Ni/Au plated electrode in the LED component and at a Sn solder end in the chip resistor. They were soldered by reflow soldering in a nitrogen atmosphere (oxygen <<500 ppm) at 240° C. The heat cycle test was carried out by repeating 1000 times a cycle from −55° C. to 125° C. with a holding period of 30 minutes at the high temperature, followed by shear testing at a velocity of 83.3 μm/s at room temperature. The strength after the shear cycle was divided by an area of Cu land on the substrate, and a shear stress was shown as a stress per unit area (hereinafter, referred to as "shear stress"). An average value of shear stresses was defined as an average shear stress, and a stress of 1.5 times as much as a stress in a case where a crack penetrated through at one side was defined as a minimum shear stress. At a stress test, if a crack penetrates through at one side, the component would not move horizontally but rotate.

Results are shown in Table 1 below.

TABLE 1

| | Ag | Cu | Bi | Sb | Ni | Co | P | Ge | Area of side-surface electrode 0% Shear strength (Mpa) | | Area of side-surface electrode 25% Shear strength (Mpa) | | Area of side-surface electrode 100% Shear strength (Mpa) | |
|---|---|---|---|---|---|---|---|---|---|---|---|---|---|---|
| | | | | | | | | | Average | Minimum | Average | Minimum | Average | Minimum |
| Example 1 | — | 1.0 | | 7.0 | 0.05 | 0.05 | | | 26 | 20 | 28 | 21 | 26 | 21 |
| Example 2 | — | 1.0 | | 10.0 | | | | | 31 | 24 | 32 | 25 | 29 | 23 |
| Example 3 | 1.0 | 0.8 | | 5.0 | | | | | 26 | 20 | 27 | 21 | 28 | 23 |
| Example 4 | 1.0 | 0.3 | | 7.0 | 0.03 | 0.1 | | | 31 | 25 | 32 | 26 | 29 | 23 |
| Example 5 | 1.0 | 1.2 | | 10.0 | | | | | 31 | 26 | 33 | 27 | 29 | 24 |
| Example 6 | 3.0 | 0.8 | | 3.0 | | | | | 29 | 23 | 31 | 24 | 30 | 24 |
| Example 7 | 3.0 | 0.8 | | 3.0 | 0.03 | | | | 31 | 21 | 32 | 25 | 32 | 26 |
| Example 8 | 3.0 | 0.8 | | 3.0 | | 0.05 | | | 31 | 23 | 29 | 26 | 31 | 26 |
| Example 9 | 3.0 | 0.8 | | 3.0 | | | 0.005 | | 29 | 22 | 32 | 25 | 32 | 22 |
| Example 10 | 3.0 | 0.8 | | 3.0 | | | | 0.003 | 29 | 22 | 29 | 23 | 32 | 24 |
| Example 11 | 3.0 | 0.8 | | 3.0 | 0.03 | 0.05 | 0.005 | 0.003 | 26 | 21 | 27 | 20 | 26 | 21 |
| Example 12 | 3.0 | 0.8 | | 5.0 | | | | | 31 | 23 | 32 | 25 | 29 | 23 |
| Example 13 | 3.0 | 0.8 | | 7.0 | | | | | 32 | 23 | 34 | 24 | 28 | 23 |
| Example 14 | 3.0 | 0.8 | | 10.0 | | | | | 36 | 28 | 38 | 30 | 29 | 23 |
| Comparative Example 1 | — | 0.8 | | 1.0 | | | | | 14 | 8 | 15 | 9 | 22 | 18 |
| Comparative Example 2 | — | 0.8 | | 13.0 | | | | | 25 | 13 | 27 | 14 | 23 | 18 |
| Comparative Example 3 | 1.0 | 0.8 | | 1.0 | | | | | 19 | 14 | 20 | 15 | 25 | 20 |
| Comparative Example 4 | 1.0 | 1.5 | | 13.0 | | | | | 23 | 7 | 24 | 7 | 25 | 20 |
| Comparative Example 5 | 3.0 | 0.8 | | 0.0 | | | | | 20 | 14 | 21 | 15 | 25 | 20 |
| Comparative Example 6 | 3.0 | 0.8 | | 1.0 | | | | | 22 | 15 | 23 | 16 | 26 | 21 |
| Comparative Example 7 | 3.0 | 0.8 | | 2.0 | | | | | 27 | 13 | 28 | 14 | 27 | 22 |
| Comparative Example 8 | 3.0 | 0.8 | 0.5 | 3.0 | | | | | 13 | 8 | 14 | 9 | 27 | 21 |
| Comparative Example 9 | 3.0 | 0.8 | 1.0 | 3.0 | | | | | 13 | 6 | 14 | 6 | 29 | 23 |
| Comparative Example 10 | 3.0 | 0.8 | | 13.0 | | | | | 25 | 8 | 27 | 9 | 23 | 19 |

In a chip resistor in which an end part is covered by an electrode, the average shear stress is smaller than that of an LED component because, normally, a chip resistor has a narrow width, with a small bonding area. Accordingly, a mere shear stress of a chip resistor is smaller as simply compared to an LED component, but when it is expressed in the shear stress as described above, a chip resistor would have a close value to that of an LED component. In chip resistors, while the shear stress slightly varied depending on the alloy composition, the average shear stress was 25 MPa or higher. In addition, in the stress test, the chip resistor did not first break at one side and thus did not fracture as rotating. For a chip resistor, different alloys do not yield much difference in about 1,000 cycles.

On the other hand, for an LED component, a shear stress of about 10 MPa is sufficient to merely maintain electrical connection. With the shear stress, however, one of two electrodes at one side surface often fractures, and in such a case, the other electrode would shortly fracture. Since the number of samples is 10 to 14 in this test, 15 MPa which is 1.5 times as much as the shear stress with which a crack has evidently propagated was defined as a minimum shear stress with which no explicit crack is seen. When the average shear stress is 25 MPa or higher, even if terminals at both opposite sides of an LED component simultaneously fracture in the shear stress test to have cracks, the crack propagation should be small, and a sufficient bonding area is apparently assured. Accordingly, an ELD component needs to have the average shear stress of 25 MPa or higher in this case.

Referring to Table 1, even when the area of the side-surface electrode accounted for 25% or 0% of an entire area of the side surface (no fillet was formed), each of the solder alloys of the invention had the minimum shear stress of 20 MPa or higher and was comparable to the case where the area of the side-surface electrode accounted for 100% of the area of the side surface (a fillet was formed). On the contrary, the solder alloys in the Comparative Examples each had a shear stress close to 20 MPa when the area of the side-surface electrode accounted for 100% of the area of the side surface (a fillet was formed), whereas, when the area of the side-surface electrode accounted for 25% or 0% of the area of the side surface (no fillet was formed), the shear stress was reduced by half.

INDUSTRIAL APPLICABILITY

As a solder alloy having the composition suitable for various applications of an LED component is used for soldering as described above, a solder structure for an LED component that is more suitable for the intended application can be formed, and a highly reliable soldered joint portion can be obtained.

DESCRIPTION OF SYMBOLS

101 Bottom Surface of LED Component
102, 202 Electrode
201 Side Surface of LED Component
301 LED Component
302 Ni/Sn Plated Electrode or Ni/Au Plated Electrode
303, 403 Solder
304, 404 Cu Electrode
305 Insulation Layer
306 Al Substrate
401 Chip resistor
402 Ni/Sn Plated Electrode
405 Glass Epoxy Substrate

The invention claimed is:

1. A solder alloy for use in a module in which a component and an Al substrate are bonded, the component having a main body made of ceramic and having a side-surface electrode with an area of not more than 30% of an entire area of a side surface, the solder alloy consisting of, by mass %: 0 to 4% of Ag; 0.3 to 1.2% of Cu; 3 to 10% of Sb, optionally not more than 0.15% in total of at least one element selected from Ni and Co, optionally not more than 0.1% in total of at least one element selected from P and Ge, and a balance of Sn.

2. The solder alloy according to claim 1, comprising, by mass %, not more than 0.15% in total of at least one element selected from Ni and Co.

3. The solder alloy according to claim 2, wherein a minimum shear stress is 15 MPa or higher.

4. The solder alloy according to claim 2, further comprising, by mass %, not more than 0.1% in total of at least one element selected from P and Ge.

5. The solder alloy according to claim 4, wherein a minimum shear stress is 15 MPa or higher.

6. The solder alloy according to claim 4, wherein an average shear stress is 25 MPa or higher.

7. The solder alloy according to claim 6, wherein a minimum shear stress is 15 MPa or higher.

8. The solder alloy according to claim 2, wherein an average shear stress is 25 MPa or higher.

9. The solder alloy according to claim 8, wherein a minimum shear stress is 15 MPa or higher.

10. The solder alloy according to claim 1, comprising, by mass %, not more than 0.1% in total of at least one element selected from P and Ge.

11. The solder alloy according to claim 10, wherein an average shear stress is 25 MPa or higher.

12. The solder alloy according to claim 11, wherein a minimum shear stress is 15 MPa or higher.

13. The solder alloy according to claim 10, wherein a minimum shear stress is 15 MPa or higher.

14. The solder alloy according to claim 1, wherein an average shear stress is 25 MPa or higher.

15. The solder alloy according to claim 14, wherein a minimum shear stress is 15 MPa or higher.

16. The solder alloy according to claim 1, wherein a minimum shear stress is 15 MPa or higher.

17. The solder alloy according to claim 1, wherein the component is an LED component.

18. An LED module in which an LED component having the solder alloy according to claim 1 is mounted.

19. An LED module in which an LED component and an Al substrate are bonded with the solder alloy according to claim 1, the LED component having a ceramic substrate and a light emitting device disposed on the ceramic substrate, being cut at a through-hole via portion in the ceramic substrate after the light emitting device is molded, and having a side-surface electrode with an area of not more than 30% of an entire area of a side surface, and the Al substrate having an insulation layer formed thereon and a Cu electrode formed on the insulation layer.

* * * * *